US012400905B2

(12) United States Patent
Li et al.

(10) Patent No.: US 12,400,905 B2
(45) Date of Patent: Aug. 26, 2025

(54) METHOD OF ELECTROSTATIC CHUCK MOTION CONTROL FOR WAFER BREAKAGE PREVENTION

(71) Applicant: Applied Materials, Inc., Santa Clara, CA (US)

(72) Inventors: Junguo Li, Sunnyvale, CA (US); Yosuke Tsumita, Kawasaki (JP); Andy Der Kae Ma, San Jose, CA (US); Andrew Eunbeom Choi, Lake Forest, IL (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 482 days.

(21) Appl. No.: 17/950,242

(22) Filed: Sep. 22, 2022

(65) Prior Publication Data

US 2024/0105494 A1 Mar. 28, 2024

(51) Int. Cl.
*H01L 21/687* (2006.01)
*H01L 21/67* (2006.01)
*H01L 21/677* (2006.01)

(52) U.S. Cl.
CPC .. *H01L 21/68742* (2013.01); *H01L 21/67259* (2013.01); *H01L 21/67706* (2013.01)

(58) Field of Classification Search
None
See application file for complete search history.

(56) References Cited

U.S. PATENT DOCUMENTS

| | | | | |
|---|---|---|---|---|
| 5,491,603 A | * | 2/1996 | Birang | H01L 21/6833 361/234 |
| 5,684,669 A | * | 11/1997 | Collins | H02N 13/00 361/234 |
| 5,956,837 A | * | 9/1999 | Shiota | H01L 21/6833 29/559 |
| 6,646,857 B2 | | 11/2003 | Anderson et al. | |
| 7,292,428 B2 | | 11/2007 | Hanawa et al. | |
| 7,995,323 B2 | | 8/2011 | Lu et al. | |

(Continued)

FOREIGN PATENT DOCUMENTS

| | | |
|---|---|---|
| JP | 2002198353 A | 7/2002 |
| JP | 2010272709 A | 12/2010 |

(Continued)

OTHER PUBLICATIONS

PCT International Search Report and Written Opinion PCT/US2023/029704 dated Nov. 27, 2023.

*Primary Examiner* — Erik T. K. Peterson
(74) *Attorney, Agent, or Firm* — Moser Taboada (57) ABSTRACT

Apparatus and methods for lifting a substrate from a substrate support include i. moving the substrate support and the substrate from a first position in a first direction toward lift pins, the substrate support having through holes each of which configured to receive a corresponding lift pin; ii. while moving the substrate support and the substrate, contacting the substrate with the lift pins; iii. upon contacting the lift pins, determining a force exerted on the lift pins; iv. comparing the determined force on the lift pins to a predetermined threshold force; and v. determining that the force on the lift pins is greater than or equal to the threshold force, and moving the substrate support away from the lift pins in a second direction opposite the first direction.

19 Claims, 5 Drawing Sheets

(56) References Cited

U.S. PATENT DOCUMENTS

| | | |
|---|---|---|
| 8,363,378 B2 | 1/2013 | Bluck et al. |
| 9,466,519 B2 | 10/2016 | Kawabata |
| 2002/0141133 A1 | 10/2002 | Anderson et al. |
| 2006/0238953 A1* | 10/2006 | Hanawa ............... H01L 21/6831 361/234 |
| 2010/0008013 A1 | 1/2010 | Lu et al. |
| 2010/0008014 A1 | 1/2010 | Lu et al. |
| 2010/0208409 A1* | 8/2010 | Bluck ................... H01L 21/683 361/234 |
| 2010/0218895 A1* | 9/2010 | Tezuka ............... H01J 37/32431 156/345.24 |
| 2010/0248490 A1* | 9/2010 | McMillin .......... H01L 21/68742 700/282 |
| 2011/0058302 A1* | 3/2011 | Valcore, Jr. ....... H01L 21/67069 361/234 |
| 2011/0111601 A1* | 5/2011 | Okita ................ H01L 21/67069 156/345.24 |
| 2012/0070996 A1* | 3/2012 | Hao .................... H01L 21/6831 438/758 |
| 2013/0189847 A1 | 7/2013 | Tezuka |
| 2015/0194330 A1* | 7/2015 | Sasaki ............... H01L 21/68792 361/234 |
| 2016/0020134 A1 | 1/2016 | Thirunavukarasu et al. |
| 2019/0074209 A1* | 3/2019 | Sasaki ................. H01L 21/6833 |

FOREIGN PATENT DOCUMENTS

| | | |
|---|---|---|
| KR | 10-2006-0023021 A | 3/2006 |
| KR | 10-2010-0107221 A | 10/2010 |

* cited by examiner

METHOD OF ELECTROSTATIC CHUCK MOTION CONTROL FOR WAFER BREAKAGE PREVENTION

FIELD

Embodiments of the present disclosure generally relate to methods, systems, and apparatus for substrate handling, and more specifically, to removal of substrates from substrate support pedestals.

BACKGROUND

Physical vapor deposition (PVD) equipment often utilizes Johnsen-Rahbek (JR) or coulombic electrostatic chucks (ESC) to clamp a substrate to a substrate support pedestal for PVD processing. Such chucks rely on electrostatic force, which is created by opposite charges accumulated on the substrate and the ESC. After PVD processing, a dechucking process can be performed to remove accumulated charges to unclamp substrate so that the substrate can be lifted from the ESC and transferred for subsequent processing. However, residual electrostatic charge and clamping force may remain after such dechucking.

Often lift pins are used to lift the substrate away from the ESC. Such lift pins can pass through holes in the ESC to contact the backside of the substrate and apply force to the substrate to lift the substrate off the ESC. If a clamping force is present on the substrate, a force greater than the clamping force is needed to lift the substrate off the ESC. However, each substrate may be damaged if the force applied to the substrate by the lift pins exceeds a certain force. Thus, if the clamping force remaining on the substrate after dechucking is greater than the certain force, the force of the lift pins on the substrate will exceed the certain force on the substrate and damage the substrate.

Accordingly, the inventors have provided embodiments of improved substrate lifting methods and systems, as disclosed herein.

SUMMARY

Methods, systems, and non-transitory machine-readable storage mediums for lifting a substrate from a substrate support are provided herein.

In some embodiments, a method of lifting a substrate from a substrate support includes: i. moving the substrate support and the substrate from a first position in a first direction toward lift pins, the substrate support having through holes each of which configured to receive a corresponding lift pin; ii. while moving the substrate support and the substrate, contacting the substrate with the lift pins; iii. upon contacting the lift pins, determining a force exerted on the lift pins; iv. comparing the determined force on the lift pins to a predetermined threshold force; and v. determining that the force on the lift pins is greater than or equal to the threshold force, and moving the substrate support away from the lift pins in a second direction opposite the first direction.

In some embodiments, a substrate lifting system for controlling the lifting of a substrate includes: a substrate support configured to support the substrate and move vertically between a first position and a release position, the substrate support having through holes; lift pins configured to pass through the through holes and contact a substrate supported by the substrate support; a motor coupled to the lift pins and configured to vertically position the lift pins; and a force feedback system configured to measure an application of force by the lift pins against the substrate and to return the substrate support to the first position if the measured force on the lift pins is greater than or equal to a threshold force.

In some embodiments, a non-transitory machine-readable storage medium is provided having stored thereon processor-executable instructions for causing the machine to perform a method of lifting a substrate from a substrate support, the method comprising: i. moving the substrate support and the substrate from a first position in a first direction toward lift pins, the substrate support having through holes each of which configured to receive a corresponding lift pin; ii. while moving the substrate support and the substrate, contacting the substrate with the lift pins; iii. upon contacting the lift pins, determining a force exerted on the lift pins; iv. comparing the determined force on the lift pins to a predetermined threshold force; and v. determining that the force on the lift pins is greater than or equal to the threshold force, and moving the substrate support away from the lift pins in a second direction opposite the first direction.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

FIGS. 2-6 schematically show various steps of a method of lifting a substrate from a chuck in accordance with the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of a method, system, and non-transitory machine-readable storage medium for lifting a substrate from a substrate support are provided herein.

As described in greater detail below, in some embodiments, closed loop control is used to prevent damage to a substrate. More specifically, in some embodiments, such closed loop control uses a lift pin driver response (motor torque or motor position) to control the application of forces to the substrate by the lift pins. Use of the lift pin driver response advantageously does not require retrofitting existing processing chambers with additional sensors or instrumentation, such as strain gauges, which can often fail under substrate processing conditions. Instead, as noted above, many process chambers already include some form of open loop motorized lift pin and substrate support control, which can be upgraded to closed loop control while retaining process compatibility.

Figure 1A:
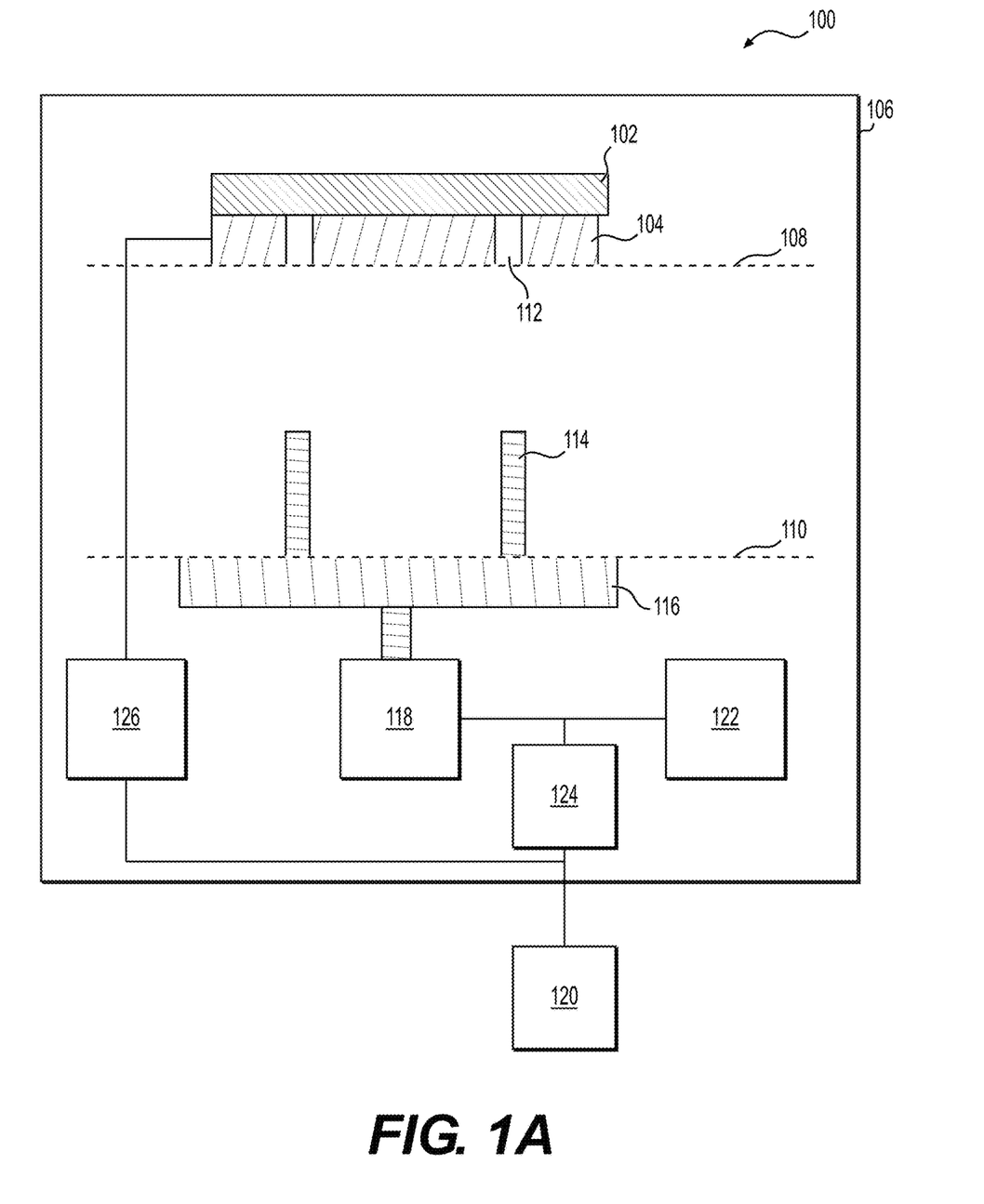
FIG. 1A is a schematic of a system for lifting a substrate from a chuck in accordance with embodiments of the present disclosure.

FIG. 1A is a is a schematic of a system 100 for lifting a substrate 102 from a substrate support 104, in accordance with embodiments of the present disclosure. In some embodiments, the system 100 may be located inside a chamber 106, which may be maintained at a vacuum.

In some embodiments, and as shown in FIG. 1A, the system 100 may include a substrate support 104 configured to support the substrate 102 and move vertically between a first position 108 and a release position 110. In some embodiments, the substrate support 104 includes an ESC, and may have through holes 112. The substrate support 104 may be connected to a motor 126 configured to raise and lower the substrate support 104 in the chamber 106. In some embodiments, and as shown in FIG. 1, the system 100 may include lift pins 114 configured to pass through the through holes 112 and contact the substrate 102 supported by the substrate support 104. In some embodiments, and as shown in FIG. 1A, the lift pins 114 may be connected to a hoop 116 to permit all of the lift pins 114 to be raised and lowered together. In some embodiments, the lift pins may be grounded (e.g., through the hoop 116) and configured to discharge some residual charge on the substrate 102 through the lift pins 114 upon contacting the lift pins 114.

In some embodiments, and as shown in FIG. 1A, the system 100 may include a motor 118 coupled to the lift pins 114 and configured to vertically position the lift pins 114 in the chamber 106. In some embodiments, the motor 118 may be a servo motor or a stepper motor. Also, in some embodiments, the system 100 may include a motor encoder 122 configured to measure motor position, which corresponds to a vertical position of the lift pins 114. In some embodiments, the motor encoder 122 and the motor 118 may be connected to a motor driver 124, such as an Ether-CAT (a.k.a. "ECAT") motor driver, configured to measure and output both motor position change and motor torque. Thus, the motor driver 124 may be configured as a torque measurement device and a position measurement device.

In some embodiments, and as shown in FIG. 1A, the system 100 may include at least one controller 120 coupled to the motor 118 (via motor driver 124) and the substrate support 104 (via motor 126). In some embodiments, the motor driver 124 may be incorporated into the controller 120. In some embodiments, the controller 120 is configured to control the relative motion and position between the substrate support 104 and the lift pins 114. In some embodiments, the controller 120 may be configured to maintain a static vertical position of the lift pins 114 while moving the substrate support 104 towards the lift pins 114 and cause contact between the substrate 102 and the lift pins 114. In some embodiments, the controller 120 may be configured to maintain a static vertical position of the substrate support 104 while moving the lift pins 114 towards the substrate support 104 and the substrate 102.

In some embodiments, the controller 120 may be configured to determine a force exerted on the lift pins 114 by the substrate 102 (which is equal to any electrostatic clamping force on the substrate 102), compare the determined force on the lift pins 114 to a predetermined threshold force, and raise the substrate support 104 to the first position 108 if the determined force on the lift pins 114 is greater than or equal to the threshold force. The force exerted on the lift pins 114 by the substrate 102 is equal to the remaining electrostatic force (i.e., clamping force) on the substrate 102.

In some embodiments, the controller 120 may be configured to continue moving the substrate support 104 in the first direction to the release position 110 causing the lift pins 114 to lift the substrate 102 away from the substrate support 104 if the determined force on the lift pins 114 from the substrate 102 is less than the threshold force.

In some embodiments, the threshold force may be set to a substrate damage limit. Thus, any force applied to the substrate at or above the substrate damage limit would cause damage to the substrate, and any force applied to the substrate below the substrate damage limit would not cause damage to the substrate. In some embodiments, the threshold force may be based on characteristics of the substrate 102, such as mechanical properties of the substrate (e.g., yield strength), and electrical properties (e.g., conductivity).

Figure 1B:
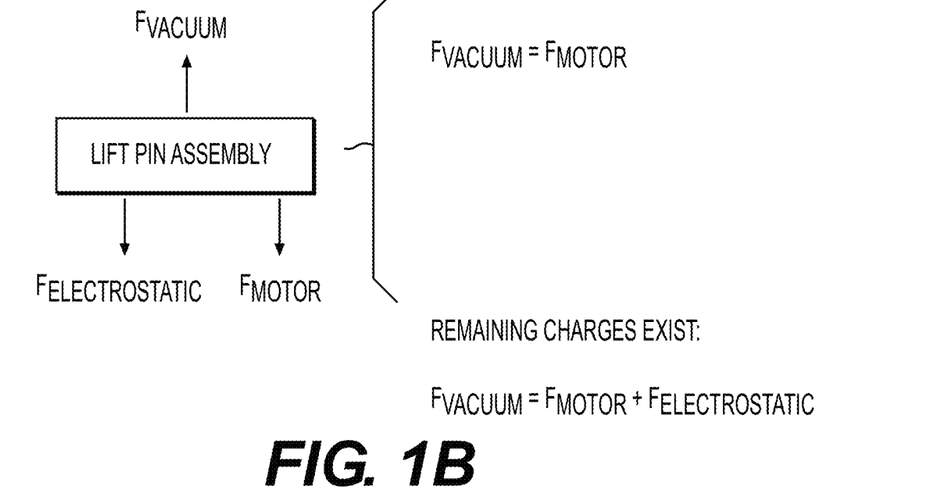
FIG. 1B shows a schematic of the forces acting on the lift pins under vacuum.

FIG. 1B shows schematically forces acting on the lift pins 114 at various states of a substrate lifting process in accordance with the disclosure. In FIG. 1B, the weight of the substrate 102 is deemed negligible. In some embodiments, and as shown in FIG. 1B, the pressure in the chamber 106 is maintained at a vacuum, which subjects the lift pins 114 to a vacuum force $F_{vacuum}$. At a first time, T1, the lift pins 114 are controlled by the motor 118 to remain stationary relative to the chamber 106 and the lift pins 114 are not in contact with the substrate 102. At the first time, T1, the force $F_{motor}$, 1 of the motor 118 acting on the lift pins 114 maintains the lift pins 114 stationary and is equal to the vacuum force $F_{vacuum}$. As discussed in greater detail below, at a second time, T2, after T1 the substrate 102 may be lowered by the substrate support 104 into contact with the lift pins 114, and if there is a remaining charge on the substrate 102 (i.e., there is a clamping force on the substrate 102), the vacuum force $F_{vacuum}$ will be equal to the sum of the electrostatic force $F_{electrostatic}$ and the force of the motor $F_{motor}$, 2 at time T2. Thus, when the vacuum force $F_{vacuum}$ in the chamber remains constant from T1 to T2, the electrostatic force $F_{electrostatic}$ will be equal to the difference between the motor force $F_{motor}$, 1 at time T1 and the motor force $F_{motor}$, 2 at time T2, both of which may be obtained from measurements of motor torque or lift pin displacement, discussed below. Also, if the difference between the motor force $F_{motor}$, 1 at time T1 and the motor force $F_{motor}$, 2 at time T2 is zero, the electrostatic force $F_{electrostatic}$ would be zero.

In some embodiments, the controller 120 is configured to determine the force exerted on the lift pins 114 by the substrate 102 based on a measurement of motor torque as the motor 118 maintains a static vertical position of the lift pins 114 in the chamber 106. For example, the motor torque may be equated to the product of the net force on the motor and a moment arm, which is a fixed value based on the physical configuration of the motor and the lift pins 114.

In another embodiment, the force exerted on the lift pins 114 by the substrate 102 may be determined based on measuring the vertical movement of the lift pins 114 upon contact with the substrate 102. For example, a change in the motor position, as measured by the motor encoder 122, may be used to determine a change in vertical position of the lift pins 114. The controller 120 may correlate the determined change in vertical position of the lift pins 114 to a force acting on the motor 118.

For example, in some embodiments, while the lift pins 114 are controlled to be maintained at a static vertical position, upon contact between the lift pins 114 and the substrate 102, the electrostatic force $F_{Electrostatic}$ unbalances the balanced forces of $F_{vacuum}$ and $F_{motor}$ on the lift pins 114. As a result of the force imbalance on the lift pins 114, the electrostatic force $F_{Electrostatic}$ may vertically displace the lift pins 114 (e.g., downwards) a distance based on a magnitude of the electrostatic force $F_{Electrostatic}$. The change in vertical position of the lift pins 114 may be compared with a configurable threshold value, which may correspond to a threshold force. If the change in vertical position of the lift pins 114 is equal to or greater than the threshold value, the lift pins 114 and substrate 102 may be separated to avoid applying more than the threshold force to the substrate 102. Otherwise, if the change in vertical position of the lift pins 114 is less than the threshold value, the substrate support 104 and the substrate 102 may be moved (e.g., lower) to the release position 110 to cause the lift pins 114 to lift the substrate 102 off the substrate support 104.

Figure 7:
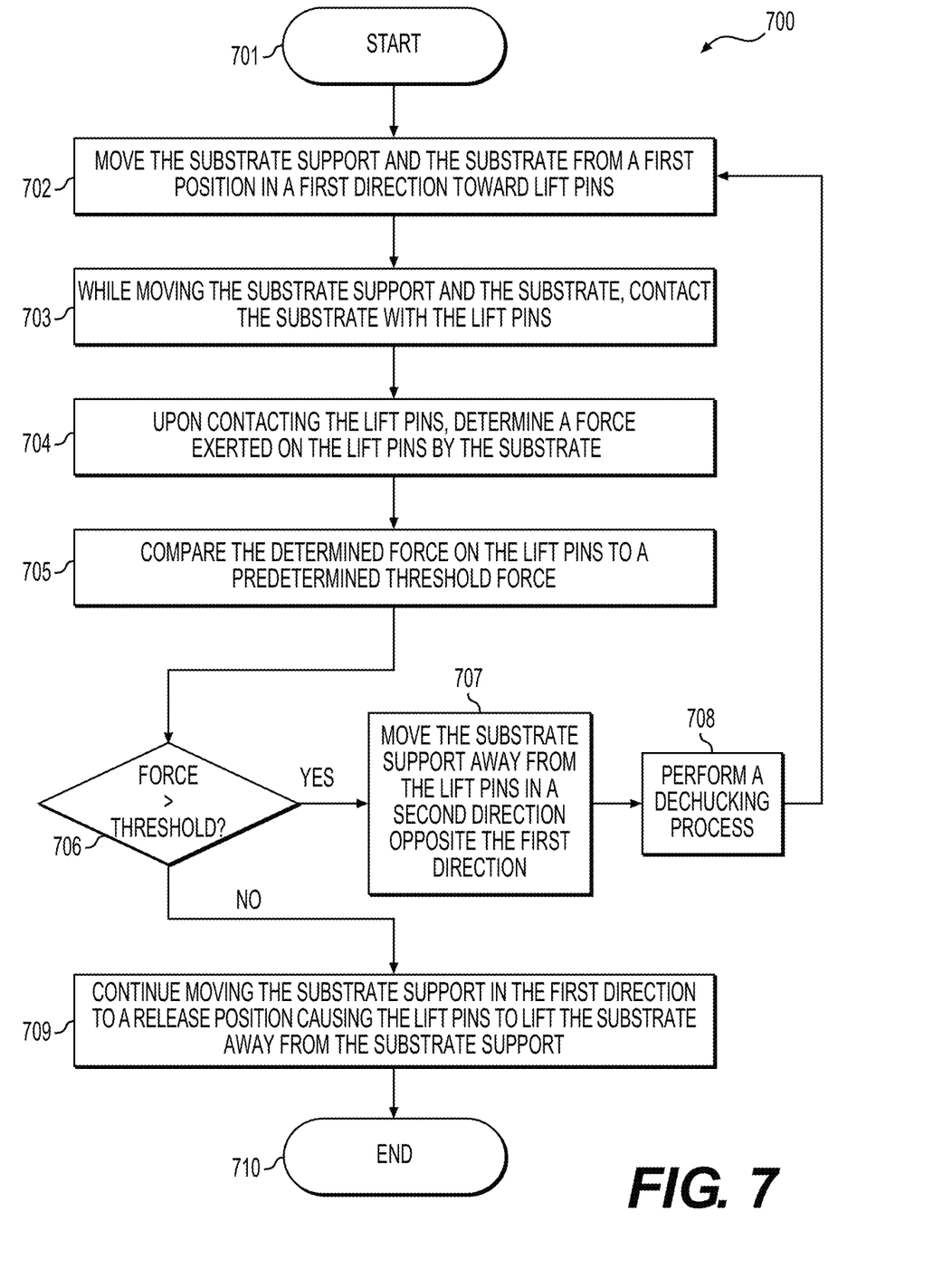
FIG. 7 is a flowchart of a method of lifting a substrate in accordance with embodiments of the present disclosure.

FIGS. 2-7 relate to a method 700 of lifting a substrate 102 in accordance with embodiments of the disclosure using, for example, the system 100 described hereinabove. In some embodiments, and as shown in FIG. 7, the method 700 may begin at 701 with the substrate 102 being supported by the substrate support 104 at the first position 108 where the substrate 102 is spaced vertically from the lift pins 114, as is shown, for example, in FIG. 2. Since the lift pins 114 are not in contact with the substrate 102, the determined force exerted on the lift pins by the substrate 102 is zero, as indicated by the indicator 202 in FIG. 2. The force exerted on the lift pins 114 may be determined as discussed above.

Figure 2:
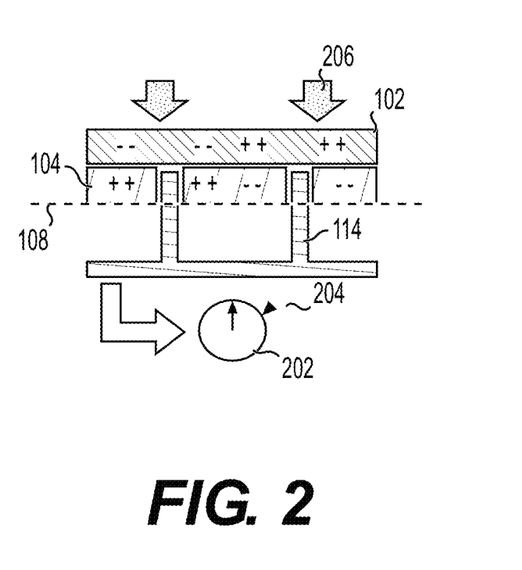
FIG. 2 is a schematic showing a substrate supported on a substrate support being lowered from a first position onto lift pins.
Figure 3:
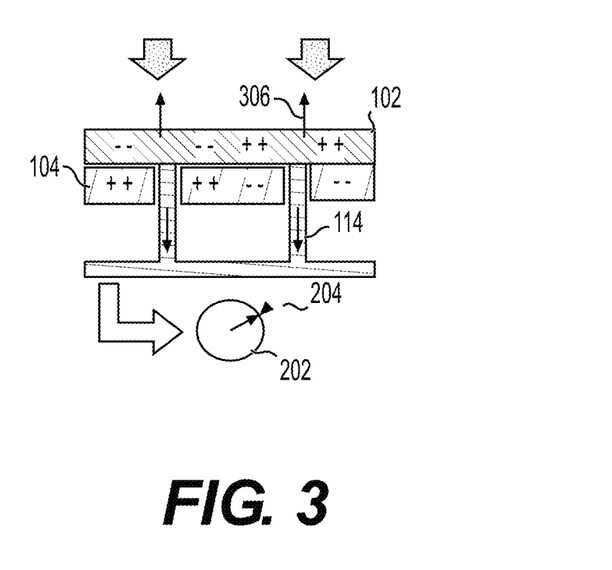
FIG. 3 is a schematic showing the substrate moved into contact with the lift pins.

At 702, the substrate support 104 and the substrate 102 are moved vertically in the chamber 106 from the first position 108 in a first direction (e.g., downward) toward the lift pins 114, as is shown in FIG. 2 by downward arrows 206. In some embodiments, the controller 120 controls the motor 118 to maintain the lift pins 114 at a certain vertical position relative to the chamber 106. At 703, at a certain point in movement of the substrate support 104 and the substrate 102 between the first position and the release position, the substrate 102 contacts the lift pins 114. At 704, upon contacting the lift pins 114 with the substrate 102, the force exerted on the lift pins 114 is determined. In the example shown in FIG. 3, the determined force indicated on indicator 202 is equal to the threshold force represented by indicator 204.

Figure 4:
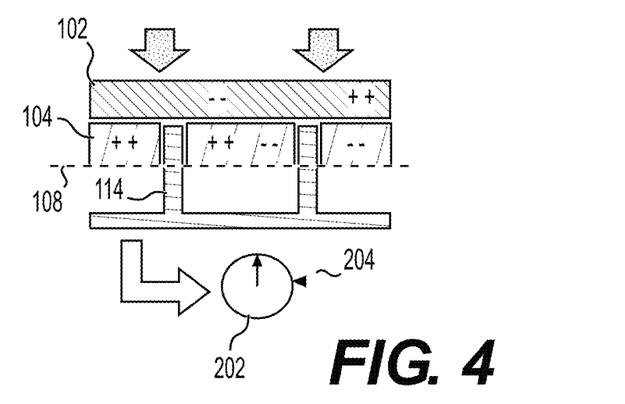
FIG. 4 is a schematic showing a subsequent lowering of the substrate from the first position onto the lift pins.
Figure 5:
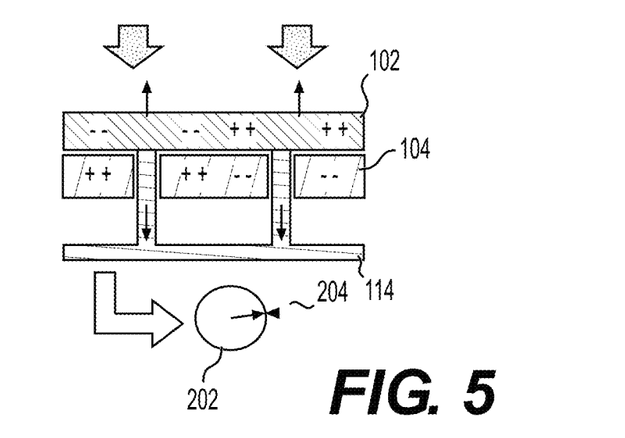
FIG. 5 is a schematic showing a subsequent movement of the substrate into contact with the lift pins.

At 705 the determined force on the lift pins is compared to a predetermined threshold force. If the determined force on the lift pins 114 is equal to or greater than a threshold force (YES at 706), then the substrate support 104 and substrate 102 are moved away from the lift pins 114 at 707 in a second direction opposite the first direction, as shown by arrows 306 in FIG. 3. The substrate support 104 may be returned to the first position, as shown for example in FIG. 4, whereupon the substrate 102 may undergo a dechucking process at 708 to remove residual charges on the substrate 102 and reduce the clamping force on the substrate 102. After such dechucking process, the method 700 may repeat 702-706, as shown in FIGS. 4 and 5 until the determined force on the lift pins 114 becomes less than the threshold force (NO at 706).

Figure 6:
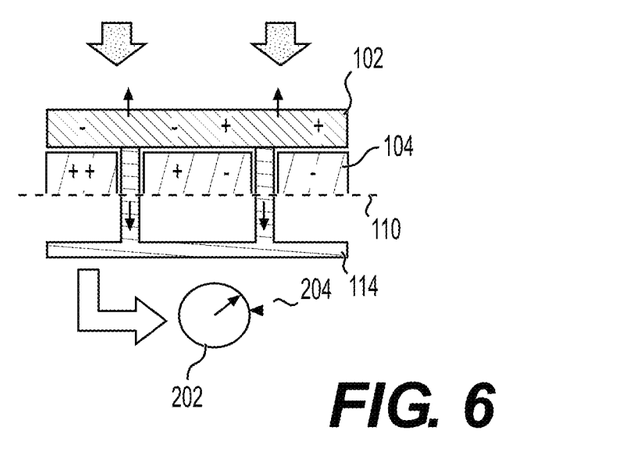
FIG. 6 is a schematic showing the substrate support in a release position with the substrate lifted off of the substrate support by the lift pins.

If the determined force on the lift pins 114 is less than the threshold force (NO at 706), then at 709 the substrate support 104 and the substrate 102 can continue to be moved in the first direction to a release position 110 causing the lift pins to lift the substrate 102 away from the substrate support 104, as shown in FIG. 6. As shown in FIG. 6, the determined force indicated in the indicator 202 is less than the threshold force 304. At 710 the method 700 may end, whereupon the substrate 102 may be transferred to another chamber connected with the chamber 106 for additional substrate processing.

Thus, the embodiments of methods and systems described herein provide closed feedback control that checks whether clamping forces on a substrate are less than a threshold force that could damage the substrate if applied by lift pins. Repeated dechucking may take place to reduce the clamping force to a level below the threshold force to permit safe lifting of the substrate from the ESC. As a result, the embodiments of methods and systems described herein can improve substrate yield and process throughput.

Various embodiments of a method of lifting a substrate, as described herein, may be executed on one or more computer systems, which may interact with various other devices. One such computer system is computer system 800 illustrated by FIG. 8, which may in various embodiments implement any of the elements or functionality illustrated in FIGS. 1A and 2-7. For example, the computer system 800 may be utilized in various embodiments of the present disclosure to implement the controller 120, according to one or more embodiments.

Figure 8:
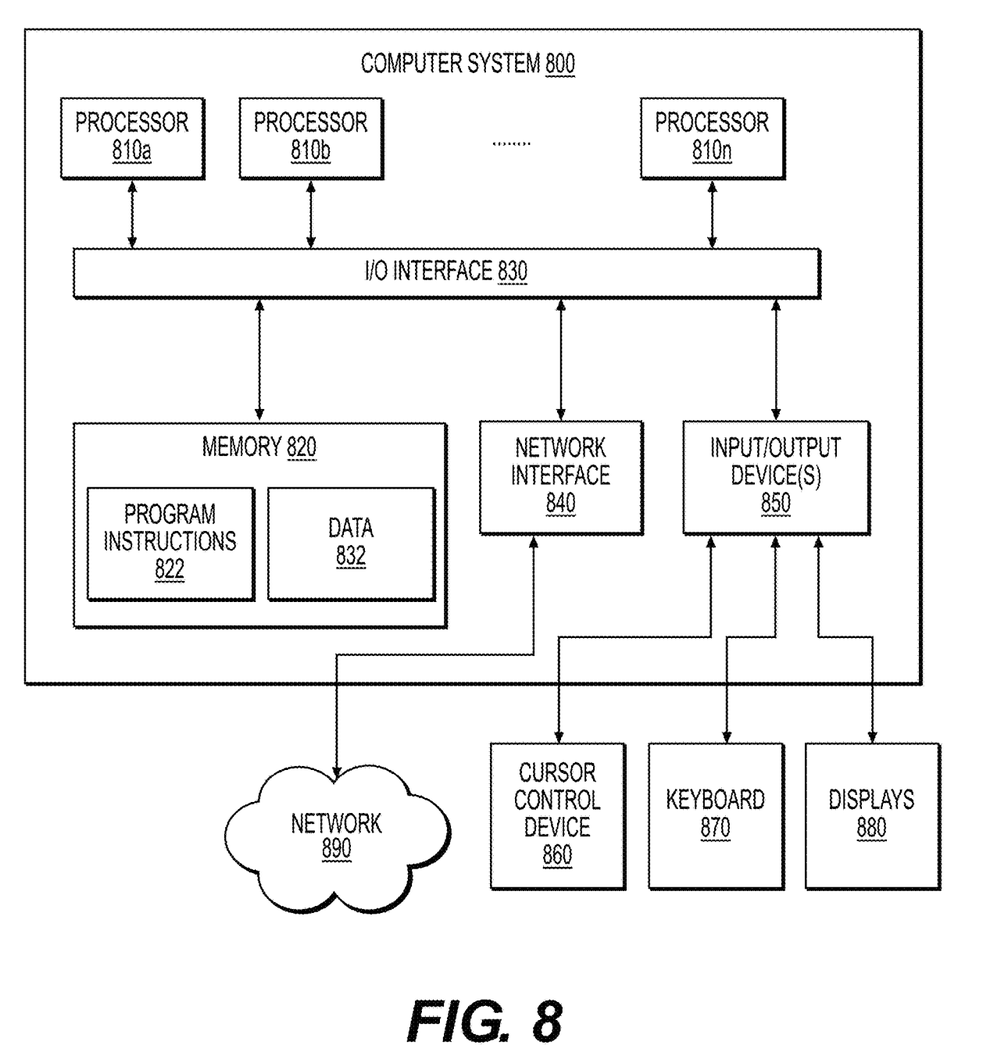
FIG. 8 is a high-level block diagram of a computing device suitable for use with embodiments for lifting substrates in accordance with the present disclosure.

In various embodiments, computer system 800 may be configured to implement method 700 described above. The computer system 800 may be used to implement any other system, device, element, functionality, or method of the above-described embodiments. In the illustrated embodiments, computer system 800 may be configured to implement the method 700 as processor-executable program instructions 822 (e.g., program instructions executable by processor(s) 810) in various embodiments.

In the illustrated embodiment, computer system 800 includes one or more processors 810a-810n coupled to a system memory 820 via an input/output (I/O) interface 830. Computer system 800 further includes a network interface 840 coupled to I/O interface 830, and one or more input/output devices 850, such as cursor control device 860, keyboard 870, and display(s) 880. The network interface 840 may be connected to a communications network 890. In various embodiments, any of the components may be utilized by the computer system 800 to receive user input described above. In various embodiments, a user interface may be generated and displayed on display 880. In some cases, embodiments may be implemented using a single instance of computer system 800, while in other embodiments multiple such systems, or multiple nodes making up computer system 800, may be configured to host different portions or instances of various embodiments. For example, in one embodiment some elements may be implemented via one or more nodes of computer system 800 that are distinct from those nodes implementing other elements. In another example, multiple nodes may implement computer system 800 in a distributed manner.

In different embodiments, computer system 800 may be any of various types of devices, including, but not limited to, a personal computer system, desktop computer, laptop, notebook, tablet or netbook computer, mainframe computer system, handheld computer, workstation, network computer, a mobile device, a consumer device, application server, storage device, a peripheral device such as a switch, modem, router, or in general any type of computing or electronic device.

In various embodiments, computer system 800 may be a uniprocessor system including one processor 810, or a multiprocessor system including several processors 810 (e.g., two, four, eight, or another suitable number). Processors 810 may be any suitable processor capable of executing instructions. For example, in various embodiments, processors 810 may be general-purpose or embedded processors implementing any of a variety of instruction set architectures (ISAs). In multiprocessor systems, each of processors 810 may commonly, but not necessarily, implement the same ISA.

System memory 820 may be configured to store program instructions 822 and/or data 832 accessible by processor 810. In various embodiments, system memory 820 may be implemented using any suitable memory technology, such as static random-access memory (SRAM), synchronous dynamic RAM (SDRAM), nonvolatile/Flash-type memory, or any other type of memory. In the illustrated embodiment, program instructions and data implementing any of the elements of the embodiments described above may be stored within system memory 820. In other embodiments, program instructions and/or data may be received, sent, or stored upon different types of computer-accessible media or on similar media separate from system memory 820 or computer system 800.

In one embodiment, I/O interface 830 may be configured to coordinate I/O traffic between processor 810, system memory 820, and any peripheral devices in the device, including network interface 840 or other peripheral interfaces, such as input/output devices 850. In some embodiments, I/O interface 830 may perform any necessary protocol, timing, or other data transformations to convert data signals from one component (e.g., system memory 820) into a format suitable for use by another component (e.g., processor 810). In some embodiments, I/O interface 830 may include support for devices attached through various types of peripheral buses, such as a variant of the Peripheral Component Interconnect (PCI) bus standard or the Universal Serial Bus (USB) standard, for example. In some embodiments, the function of I/O interface 830 may be split into two or more separate components, such as a north bridge and a south bridge, for example. Also, in some embodiments some or all of the functionality of I/O interface 830, such as an interface to system memory 820, may be incorporated directly into processor 810.

Network interface 840 may be configured to allow data to be exchanged between computer system 800 and other devices attached to a network, such as one or more external systems or between nodes of computer system 800. In various embodiments, communications network 890 may include one or more networks including but not limited to Local Area Networks (LANs) (e.g., an Ethernet or corporate network), Wide Area Networks (WANs) (e.g., the Internet), wireless data networks, some other electronic data network, or some combination thereof. In various embodiments, network interface 840 may support communication via wired or wireless general data networks, such as any suitable type of Ethernet network, for example; via digital fiber communications networks; via storage area networks such as Fiber Channel SANs, or via any other suitable type of network and/or protocol.

Input/output devices 850 may, in some embodiments, include one or more display terminals, keyboards, keypads, touchpads, scanning devices, voice or optical recognition devices, or any other devices suitable for entering or accessing data by one or more computer systems 800. Multiple input/output devices 850 may be present in computer system 800 or may be distributed on various nodes of computer system 800. In some embodiments, similar input/output devices may be separate from computer system 800 and may interact with one or more nodes of computer system 800 through a wired or wireless connection, such as over network interface 840.

Those skilled in the art will appreciate that computer system 800 is merely illustrative and is not intended to limit the scope of embodiments. In particular, the computer system and devices may include any combination of hardware or software that can perform the indicated functions of various embodiments. Computer system 800 may also be connected to other devices that are not illustrated, or instead may operate as a stand-alone system. In addition, the functionality provided by the illustrated components may in some embodiments be combined in fewer components or distributed in additional components. Similarly, in some embodiments, the functionality of some of the illustrated components may not be provided and/or other additional functionality may be available.

Those skilled in the art will also appreciate that, while various items are illustrated as being stored in memory or on storage while being used, these items or portions of them may be transferred between memory and other storage devices for purposes of memory management and data integrity. Alternatively, in other embodiments, some or all of the software components may execute in memory on another device and communicate with the illustrated computer system via inter-computer communication. Some or all of the system components or data structures may also be stored (e.g., as instructions or structured data) on a computer-accessible medium or a portable article to be read by an appropriate drive, various examples of which are described above. In some embodiments, instructions stored on a computer-accessible medium separate from computer system 800 may be transmitted to computer system 800 via transmission media or signals such as electrical, electromagnetic, or digital signals, conveyed via a communication medium such as a network and/or a wireless link. Various embodiments may further include receiving, sending, or storing instructions and/or data implemented in accordance with the foregoing description upon a computer-accessible medium or via a communication medium. In general, a computer-accessible medium may include a storage medium or memory medium such as magnetic or optical media, e.g., disk or DVD/CD-ROM, volatile or non-volatile media such as RAM (e.g., SDRAM, DDR, RDRAM, SRAM, and the like), ROM, and the like.

Embodiments in accordance with the disclosure may be implemented in hardware, firmware, software, or any combination thereof. Embodiments may also be implemented as instructions stored using one or more machine-readable media, which may be read and executed by one or more processors. A machine-readable medium may include any mechanism for storing or transmitting information in a form readable by a machine (e.g., a computing device or a "virtual machine" running on one or more computing devices). For example, a machine-readable medium may include any suitable form of volatile or non-volatile memory.

Modules, data structures, and the like defined herein are defined as such for ease of discussion and are not intended to imply that any specific implementation details are required. For example, any of the described modules and/or data structures may be combined or divided into sub-modules, sub-processes or other units of computer code or data as may be required by a particular design or implementation.

While the foregoing is directed to embodiments of the present disclosure, other and further embodiments of the disclosure may be devised without departing from the basic scope thereof.

The invention claimed is:

1. A method of lifting a substrate from a substrate support, the method comprising:
   (i) moving the substrate support and the substrate from a first position in a first direction toward lift pins, the substrate support having through holes each of which configured to receive a corresponding lift pin;
   (ii) while moving the substrate support and the substrate, contacting the substrate with the lift pins;
   (iii) upon contacting the lift pins, determining a force exerted on the lift pins;
   (iv) comparing the determined force on the lift pins to a predetermined threshold force; and
   (v) determining that the force on the lift pins is greater than or equal to the threshold force, and moving the substrate support away from the lift pins in a second direction opposite the first direction.

2. The method of claim 1, further comprising repeating (i)-(iv) until the determined force on the lift pins is less than the threshold force.

3. The method of claim 2, further comprising performing a process to remove at least some residual charge on the substrate each time (i)-(iv) are repeated.

4. The method of claim 1, further comprising determining that the force on the lift pins is less than the threshold force, and continue moving the substrate support in the first direction to a release position causing the lift pins to lift the substrate away from the substrate support.

5. The method of claim 1, wherein determining the force includes measuring a motor torque of a motor controlling a static position of the lift pins.

6. The method of claim 1, wherein determining the force includes measuring a change in position of the lift pins upon contacting the substrate with the lift pins.

7. The method of claim 6, wherein measuring the change in position includes measuring motor position of a motor controlling a static position of the lift pins.

8. The method of claim 1, wherein the threshold force is based on one or more characteristics of the substrate.

9. A substrate lifting system for controlling the lifting of a substrate comprises:
   a substrate support configured to support the substrate and move vertically between a first position and a release position, the substrate support having through holes each of which is configured to receive a corresponding lift pin;
   lift pins configured to pass through the through holes and contact a substrate supported by the substrate support;
   a motor coupled to the lift pins and configured to vertically position the lift pins; and
   a force feedback system configured to determine a force exerted on the lift pins by the substrate and to return the substrate support to the first position if the determined force is greater than or equal to a threshold force,
   wherein the force feedback system is configured to:
   (i) move the substrate support and the substrate from a first position in a first direction toward the lift pins and cause contact between the substrate and the lift pins;
   (ii) determine a force exerted on the lift pins upon contact with the substrate;
   (iii) compare the determined force on the lift pins to the predetermined threshold force; and
   (iv) determine that the force on the lift pins is greater than or equal to the threshold force, and move the substrate support away from the lift pins in a second direction opposite the first direction.

10. The system of claim 9, wherein the force feedback system is configured to move the substrate support in the first direction to a release position causing the lift pins to pass through the through holes and cause the substrate to lift away from the substrate support if the determined force is less than the threshold force.

11. The system of claim 9, wherein the force feedback system includes:
    a torque measurement device for measuring a motor torque of the motor upon contact between the substrate and the lift pins; and
    a controller for controlling vertical movement of the substrate support based on the measured motor torque.

12. The system of claim 11, wherein the controller is configured to determine the force based on the measured motor torque and to raise the substrate support away from the lift pins if the determined force is greater than or equal to the threshold force.

13. The system of claim 9, wherein the force feedback system includes:
    an encoder configured to detect motor position corresponding to a position of the lift pins, and
    a controller for controlling vertical movement of the substrate support based on a change in the detected motor position upon contact of the substrate with the lift pins.

14. The system of claim 13, wherein the controller is configured to determine the force based on the change in the detected motor position and to raise the substrate support away from the lift pins if the determined force is greater than or equal to the threshold force.

15. A non-transitory machine-readable storage medium having stored thereon processor-executable instructions for causing the machine to perform a method of lifting a substrate from a substrate support, the method comprising:
    (i) moving the substrate support and the substrate from a first position in a first direction toward lift pins, the substrate support having through holes each of which configured to receive a corresponding lift pin;
    (ii) while moving the substrate support and the substrate, contacting the substrate with the lift pins;
    (iii) upon contacting the lift pins, determining a force exerted on the lift pins;
    (iv) comparing the determined force on the lift pins to a predetermined threshold force; and
    (v) determining that the force on the lift pins is greater than or equal to the threshold force, and moving the substrate support away from the lift pins in a second direction opposite the first direction.

16. The non-transitory machine-readable storage medium of claim 15, wherein the method further comprises repeating (i)-(iv) until the determined force on the lift pins is less than the threshold force.

17. The non-transitory machine-readable storage medium of claim 16, wherein the method further comprises performing a process to remove at least some residual charge on the substrate each time (i)-(iv) are repeated.

18. The non-transitory machine-readable storage medium of claim 15, wherein the method further comprises determining that the force on the lift pins is less than the threshold force and continue moving the substrate support in the first direction to a release position causing the lift pins to lift the substrate away from the substrate support.

19. The non-transitory machine-readable storage medium of claim 15, wherein determining the force includes:
   measuring a change in motor torque of a motor controlling a static position of the lift pins upon contact between the lift pins and the substrate and determining the force based upon the change in motor torque, or
   measuring a change in position of the lift pins from a change in motor position upon contacting the lift pins with the substrate and determining the force based upon the change in motor position.

* * * * *